United States Patent
Hsu et al.

(10) Patent No.: US 11,124,879 B2
(45) Date of Patent: Sep. 21, 2021

(54) SYSTEMS AND METHODS FOR UPPER SUSCEPTOR RINGS

(71) Applicant: Taiwan Semiconductor Manufacturing Co., Ltd., Hsinchu (TW)

(72) Inventors: Yun-Jie Hsu, Hsinchu (TW); J. C. Huang, Hsinchu (TW); Yang-Sheng Tseng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 126 days.

(21) Appl. No.: 16/188,148

(22) Filed: Nov. 12, 2018

(65) Prior Publication Data

US 2019/0144997 A1    May 16, 2019

Related U.S. Application Data

(60) Provisional application No. 62/585,462, filed on Nov. 13, 2017.

(51) Int. Cl.
| | |
|---|---|
| C23C 16/458 | (2006.01) |
| H01L 21/02 | (2006.01) |
| C23C 16/52 | (2006.01) |
| C23C 16/48 | (2006.01) |

(52) U.S. Cl.
CPC ...... C23C 16/4586 (2013.01); C23C 16/4581 (2013.01); C23C 16/481 (2013.01); C23C 16/52 (2013.01); H01L 21/02271 (2013.01)

(58) Field of Classification Search
CPC .................. C23C 16/4583; C23C 16/4586
See application file for complete search history.

(56) References Cited

U.S. PATENT DOCUMENTS

| | | | |
|---|---|---|---|
| 8,394,229 B2 | 3/2013 | Aggarwal et al. | |
| 2001/0015262 A1* | 8/2001 | Denpoh ............ | H01J 37/32642 156/345.37 |
| 2010/0284438 A1* | 11/2010 | Aggarwal ........... | C23C 16/4586 374/179 |
| 2016/0002788 A1* | 1/2016 | Nal ................... | C23C 16/45521 118/724 |

* cited by examiner

*Primary Examiner* — Joseph A Miller, Jr.
(74) *Attorney, Agent, or Firm* — Duane Morris LLP

(57) ABSTRACT

In an embodiment, a susceptor ring assembly for use in a semiconductor processing tool includes: an upper ring plate having an aperture formed therethrough, the upper ring plate including: a first upper ring wall extending from the upper ring plate along the aperture; a second upper ring wall extending from the upper ring plate and concentric with the first upper ring wall; a bridge extending between the first upper ring wall and the second upper ring wall; a lower ring configured to interlock with the upper ring plate, the lower ring including: a lower ring wall concentric with the first upper ring wall, wherein the lower ring wall is configured to abut the first upper ring wall; and a lower plate parallel with the bridge and extending from the lower ring wall.

20 Claims, 6 Drawing Sheets

SYSTEMS AND METHODS FOR UPPER SUSCEPTOR RINGS

CROSS-REFERENCE TO RELATED APPLICATIONS

This application claims priority to U.S. Application No. 62/585,462, filed Nov. 13, 2017. The content of the above application is incorporated by reference in its entirety.

BACKGROUND

In the processing of semiconductor devices (e.g., transistors, diodes, and integrated circuits) a plurality of such devices are typically fabricated simultaneously on a thin slice of semiconductor material (e.g., a substrate, wafer, or workpiece). In one example of a semiconductor processing step during manufacture of such semiconductor devices, the substrate or other workpiece is typically transported into a reaction chamber in which a thin film, or layer, of a material is deposited on an exposed surface of the substrate. Once the desired thickness of the layer of material has been deposited, the substrate may be further processed within the reaction chamber or transported out of the reaction chamber for further processing.

The substrate is typically transferred into the reaction chamber by way of a wafer handling mechanism. The wafer handling mechanism lifts the substrate from a position outside the reaction chamber and inserts the substrate into the reaction chamber through a valve formed in a wall of the reaction chamber. Once the substrate is transferred into the reaction chamber, the substrate is dropped onto a susceptor to be disposed on the susceptor. After the substrate is received on the susceptor, the wafer handling mechanism is withdrawn from the reaction chamber and the valve is closed such that processing of the substrate can begin. In an embodiment, a susceptor ring is located adjacent to, and surrounds, the susceptor upon which the substrate is disposed during processing. The susceptor ring may house a thermocouple configured to collect temperature sensor data during processing.

Due at least to the fluctuation in temperatures within the reaction chamber as well as the high temperatures to which a susceptor ring is exposed, gaps or spaces may form in a susceptor ring. These spaces often allow process gases to enter the gap in which the thermocouples are located. The process gases can contact the outer surface of the thermocouple within the susceptor ring and cause deterioration of the thermocouple. The deterioration of the thermocouple may lead to a reduction in the accuracy of the temperature measured and the reduction of the lifetime of the thermocouple. Therefore, traditional susceptor ring assemblies are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
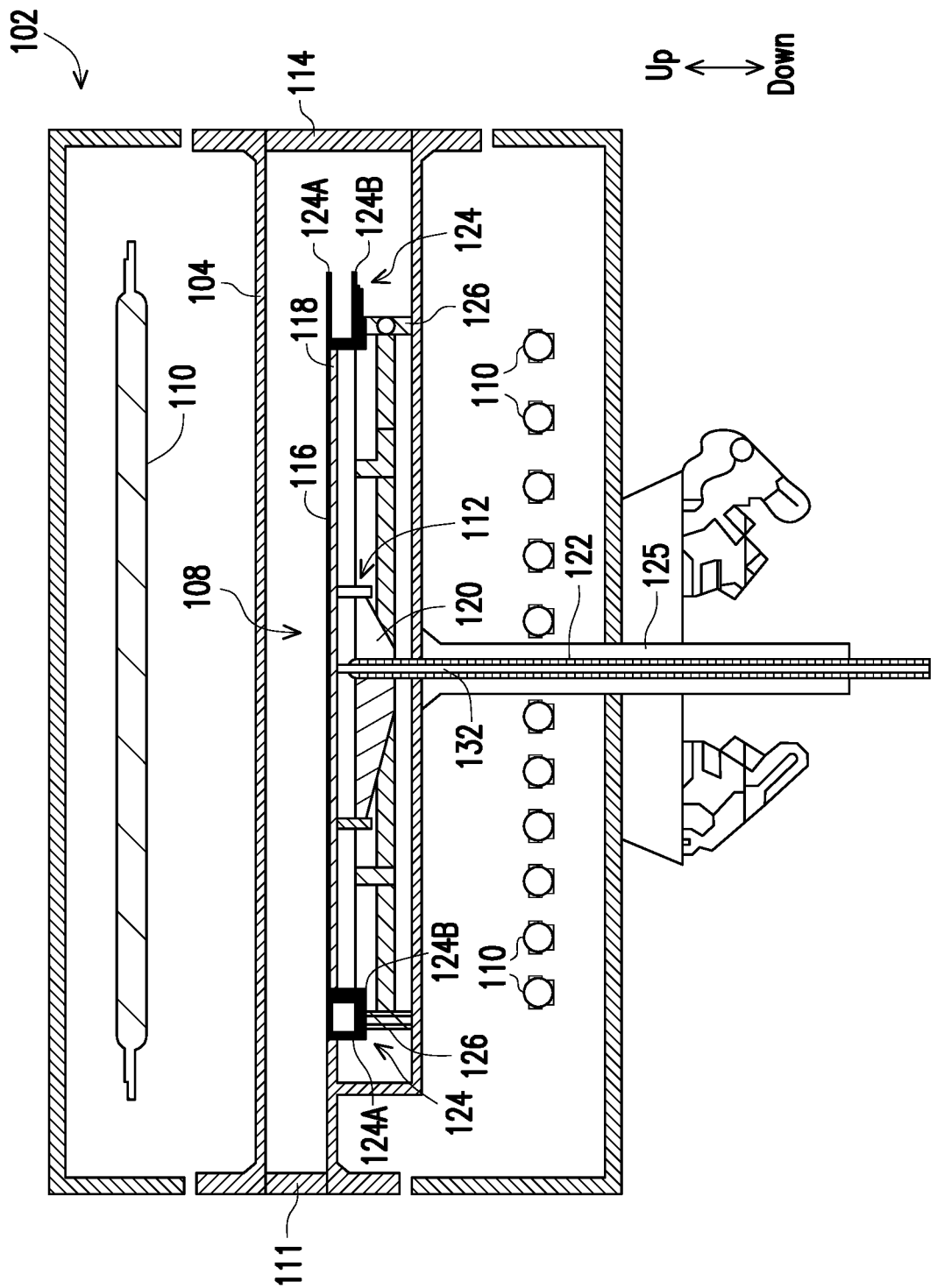
FIG. 1 is a cross-sectional view of a reactor for a semiconductor processing tool with a susceptor ring assembly, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Typically, a susceptor ring is structured as a two piece susceptor ring assembly that is disposed about, and adjacent to, a susceptor that supports a substrate during processing. The susceptor ring assembly is designed to absorb and retain radiant energy from heating source(s) during processing to reduce the amount of energy loss from the edge of the susceptor and substrate. The susceptor ring assembly is also configured to receive and locate temperature sensing devices, such as a thermocouple, at different locations about the susceptor. A thermocouple may be utilized to measure localized temperatures about the susceptor. The susceptor ring assembly typically includes an upper ring and a lower ring, wherein a corridor is formed between the upper and lower rings for a thermocouple. Each of these thermocouples is comprised of two wires formed of dissimilar metals that are fused at one end to form a thermocouple junction therebetween. An internal ceramic insulator may maintain a separation between the wires of the thermocouple and a sheath made of a non-conductive material able to withstand high temperatures may surround the ceramic insulator and wires. In certain embodiments, the sheath may be made of a material such as quartz.

Typically, an upper susceptor ring and the lower susceptor ring both include an L shaped structure, such that the two L shaped structures may connect at their extremities to form a susceptor ring assembly with a single walled, rectangular cross section. However, due at least to the fluctuation in temperatures within the reaction chamber as well as the high temperatures to which the two-piece susceptor ring is exposed, parts of the lower and upper susceptor ring may not fully connect and form gaps between the upper ring and the lower ring. These spaces often allow process gases to enter the gap in which the thermocouples are located. The process gases can contact the outer surface of the thermocouples and cause deterioration of the thermocouple sheath. The deterioration of the sheath of the thermocouple may lead to a reduction in the accuracy of the temperature measured and the reduction of the lifetime of the thermocouple.

Accordingly, the present disclosure provides various embodiments of upper susceptor rings and susceptor ring assemblies. These upper susceptor rings may include full enclosure at the ends of a thermocouple disposed within the upper susceptor ring and at least partial enclosure for the thermocouple along other parts of the upper susceptor ring. Furthermore, the upper susceptor ring may include full enclosure for a thermocouple when closer to a leading edge of the upper susceptor ring and partial enclosure of the thermocouple (e.g., enclosure with an exit opening for thermocouple egress from the upper susceptor ring) when closer to a trailing edge of the upper susceptor ring. Also, an enclosure of the upper susceptor ring for a thermocouple may extend from the ring walls of the upper susceptor ring toward the trailing edge of the upper susceptor ring.

When assembled as part of a thermocouple assembly with a bottom susceptor ring, the thermocouple assembly may be double walled in parts where the upper susceptor ring overlaps with the lower susceptor ring. For example, the lower susceptor ring may still be structured with a traditional L shape. This L shape structure of the lower susceptor ring would form a double wall when overlaid in conjunction with a fully enclosed portion of an upper susceptor ring.

FIG. 1 is a cross-sectional view of a reactor for a semiconductor processing tool with a susceptor ring assembly, in accordance with some embodiments. The semiconductor processing tool may be, for example, a chemical vapor deposition ("CVD") reactor 102. While the illustrated embodiment is a single substrate, horizontal flow, cold-wall reactor, it should be understood by one skilled in the art that the susceptor ring technology described herein may be used in other types of semiconductor processing reactors. The reactor 102 includes a reaction chamber 104 defining a reaction space 108, radiant heating elements 110 located on opposing sides of the reaction chamber 104, and a susceptor support mechanism 112. The reaction chamber 104 is an elongated member having an inlet 111 for allowing reactant gases to flow into the reaction space 108 and an outlet 114 through which the reactant gases and process by-products exit the reaction space 108. In an embodiment, the reaction chamber 104 is formed of transparent quartz. It should be understood by one skilled in the art that the reaction space 108 may be formed of any other material sufficient to be substantially non-reactive with respect to the reactant gases introduced into the reaction space 108 and the process by-products resulting from a process reaction.

The heating elements 110 form an upper bank and a lower bank. The heating elements 110 are oriented in a spaced-apart manner relative to adjacent heating elements 110 within the same bank. In an embodiment, the heating elements 110 of the upper bank are oriented substantially perpendicular relative to the heating elements 110 of the lower bank. The heating elements 110 provide radiant energy to the reaction chamber 104 without appreciable absorption by the walls of the reaction chamber 104. The heating elements 110 are configured to provide radiant heat of wavelengths absorbed by the substrate 116 being processed.

The susceptor support mechanism 112 includes a susceptor 118, upon which the substrate 116 is disposed during processing. A susceptor ring assembly 124 surrounds at least a portion of the susceptor support mechanism 112. The susceptor support 120 of the susceptor support mechanism 112 is connected to a shaft 122 that extends downwardly through a tube 125 extending from the lower wall of the reaction chamber 104. A motor (not shown) is configured to rotate the shaft 122, thereby rotating the susceptor support 120 which in turn rotates the susceptor 118 and the substrate 116 disposed thereon. The susceptor ring assembly 124 is maintained at a location within the reaction chamber 104 by a susceptor ring support 126. As will be discussed in further detail below, the susceptor ring assembly 124 may include an upper susceptor ring 124A, with a portion exposed to the reaction space 108, and a lower susceptor ring 124B interfaced with a lower part of the upper susceptor ring 124A. In certain embodiments, a central thermocouple 132 may be disposed in the tube 125 with an extremity that terminates at the susceptor 118.

Figure 2A:
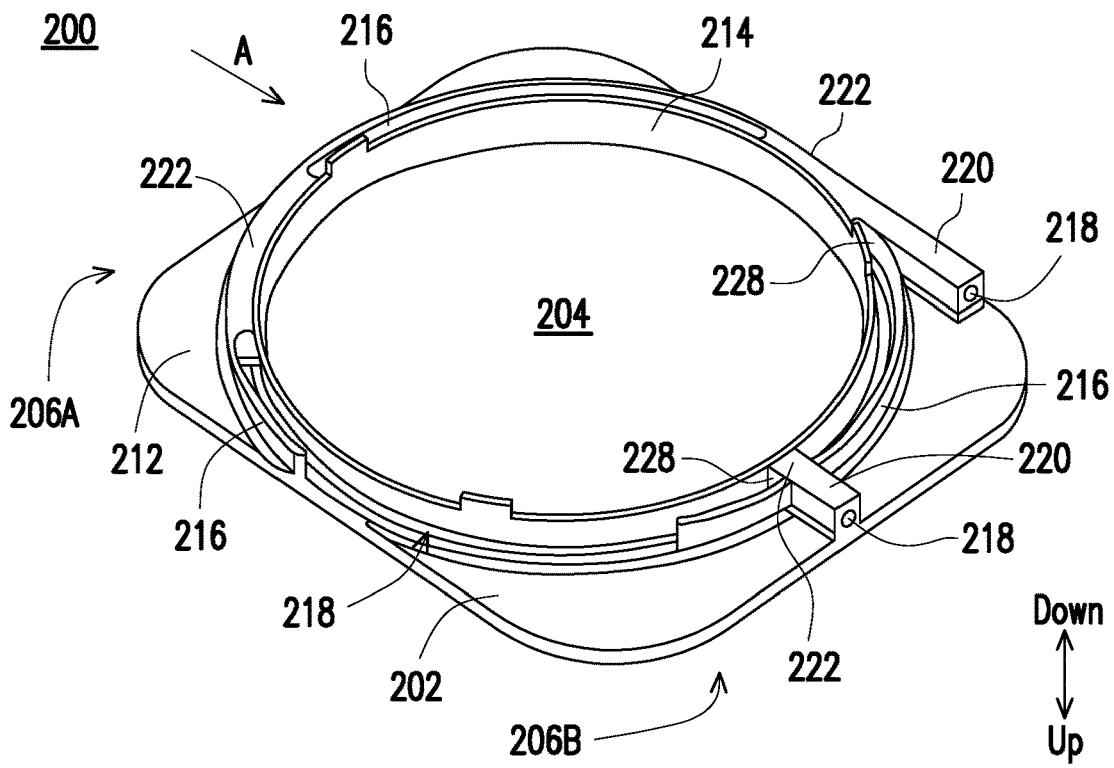
FIG. 2A is a perspective view a upper susceptor ring, in accordance with some embodiments.

FIG. 2A is a perspective view a upper susceptor ring 200, in accordance with some embodiments. For ease of illustration, FIG. 2A is illustrated with the upper susceptor ring 200 flipped so that the bottom part is up or, in other words, FIG. 2A is a bottom perspective view. Returning to FIG. 2A, the upper susceptor ring 200 may be formed as a substantially square member. In an embodiment, the upper susceptor ring 200 has rounded corners. In another embodiment, the upper susceptor ring 200 has squared corners (not shown). It should be understood by one skilled in the art that the upper susceptor ring 200 can be formed as any shape to fit within different shaped and types of reaction chambers. The upper susceptor ring 200 includes a plate 202 having an aperture 204 formed through the thickness of the plate 202. In an embodiment, the aperture 204 is generally formed at the center of the plate 202, but it should be understood by one skilled in the art that the aperture 204 may be offset from the center of the plate 202. The aperture 204 is configured to receive and surround a susceptor therein or any other apparatus or mechanism configured to support a substrate during processing. In an embodiment, the aperture 204 is circular, but it should be understood by one skilled in the art that the shape of the aperture 204 should correspond to the shape of the susceptor about which the upper susceptor ring 200 is disposed.

The plate 202 of the upper susceptor ring 200 includes a leading edge 206A and a trailing edge 206B. The plate 202 is aligned within the reaction chamber (discussed above) such that the leading edge 206A of the plate 202 (and the upper susceptor ring 200) is toward the upstream side and is directed toward the inlet of the reaction space and the trailing edge 206B of the plate 202 is on the downstream side and is directed toward the outlet of the reaction space of a reaction chamber. The process gases flow along the flow path direction A within the reaction space of the reaction chamber. In the illustrated embodiment, the upper surface (not illustrated) of the upper susceptor ring 200 is substantially planar and is opposite the lower surface 212 of the upper susceptor ring 200. It should be understood by one skilled in the art that the upper surface of the upper susceptor ring 200 can be positioned in any manner relative to the upper surface of the susceptor, such as being flush with the upper surface of the susceptor or having an offset from the upper surface of the susceptor.

The lower surface 212 of the illustrated plate 202 (and the upper susceptor ring 200) includes a portion that is substantially planar and parallel to the upper surface. It should be understood by one skilled in the art that the thickness of the plate 202 between the upper surface and lower surfaces 212 can be sufficient to provide a mass capable of absorbing and retaining radiant energy from heating elements to prevent significant heat loss from the outer radial edge of the susceptor and the substrate.

The upper susceptor ring 200 may include an inner ring wall 214 that surrounds (e.g., encircles) the aperture 204 and extends from the lower surface 212. The upper susceptor ring 200 may also include an outer ring wall 216 substantially concentric with the inner ring wall 214 (e.g., encircling the inner ring wall 214) and extending from the lower surface 212. The outer ring wall may include an exit opening for which a thermocouple may extend out of the upper susceptor ring 200 toward the trailing edge 206B. Furthermore, the outer ring wall may interface with an enclosed exit opening 220 which extends from the outer ring wall toward the trailing edge 206B in an enclosed manner (e.g., with only an exit opening 218 toward the trailing edge 206B). Accordingly, the outer ring wall 216 may partially surround the inner ring wall 214 as the outer ring wall 216 may be interspersed with exit openings 218. Furthermore, the exit openings may be of a cross sectional size for a thermocouple to fit through, or may be of a larger size to facilitate easier manipulation of a thermocouple within the corridor between the outer ring wall 216 and the inner ring wall 214. Furthermore, parts of the upper susceptor ring 200 may include a bridge wall 222 (also termed as a lower enclosure portion, plate, or wall) that extends from the extremities of the inner ring wall 214 to the extremities of the inner ring wall 216. The portion of the upper susceptor ring 200 with a bridge wall may form an enveloped cross sectional corridor between the inner ring wall 214 and the outer ring wall 216. Furthermore, in certain embodiments, an intermediate wall 228 may fill a portion of the upper susceptor ring 200 between the inner ring wall 214 and the outer ring wall 216 such that a space between the inner ring wall 214 and the outer ring wall 216 may not be continuous. The various walls 214, 216, 222 may provide structural support to the upper susceptor ring 200, protection for an enclosed thermocouple, as well as additional mass for the absorption and retention of energy. It should be understood by one skilled in the art that the upper susceptor ring 200 may include additional or fewer walls 214, 216, 222, 228, depending upon the number and/or location of thermocouples (or other measuring devices) used as well as the temperature measurement profile desired.

Figure 2B:
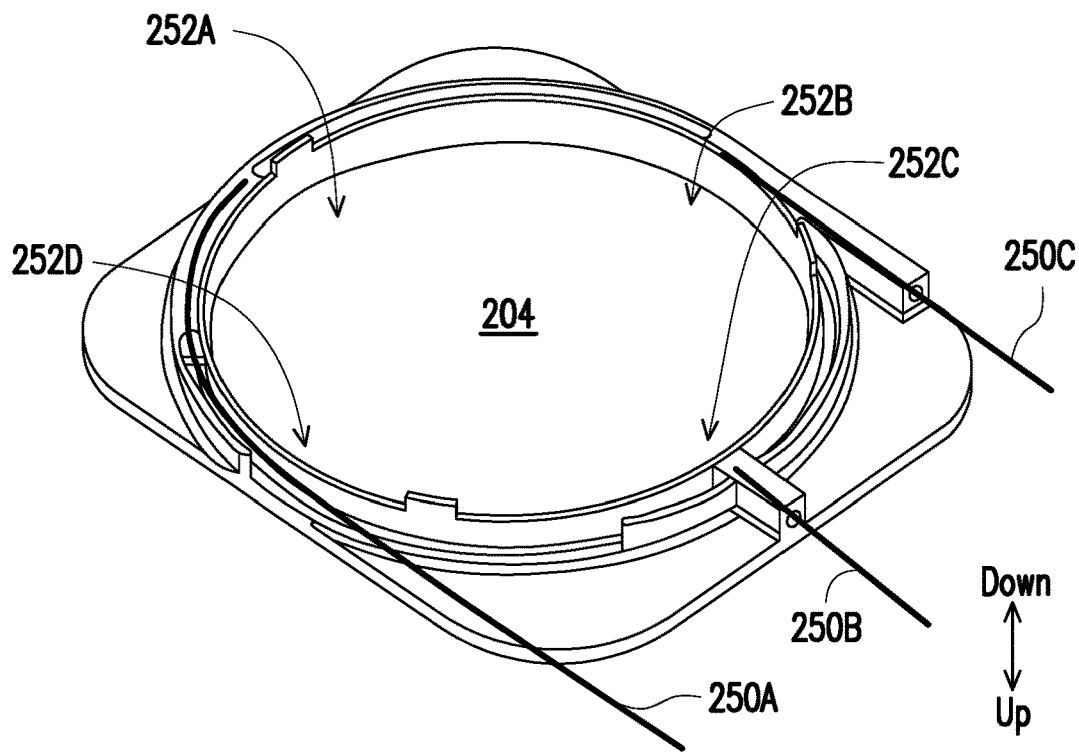
FIG. 2B is a perspective view a upper susceptor ring illustrated with overlaid thermocouple placement positions, in accordance with some embodiments.

FIG. 2B is a perspective view of the upper susceptor ring 200 of FIG. 2A overlaid with illustrative thermocouple placement positions, in accordance with some embodiments. Three thermocouples in three respective placement positions 250A, 250B, and 250C may be housed within the upper susceptor ring 200. The three thermocouples may provide temperature data (e.g., collect temperature sensor data) from at least four positions 252A, 252B, 252C, and 252D around the aperture 204 near the terminus of each thermocouple, respectively. These positions may correspond to a 12 o'clock position 252A, a three o'clock position 252B, a six o'clock position 252C, and a nine o'clock position 252D. The thermocouple at placement position 250A may provide temperature data along an arc around the aperture, corresponding to the nine o'clock position 252D and the 12 o'clock position 252A. Conventional thermocouples may be utilized within the upper susceptor ring 200. For example, the thermocouples may be single-junction, bi-junction, or multi junction thermocouples such that localized temperature measurements can be taken at different locations along the length of a thermocouple. Therefore, a discussion of thermocouples will not be included herein in detail for brevity.

Figure 2C:
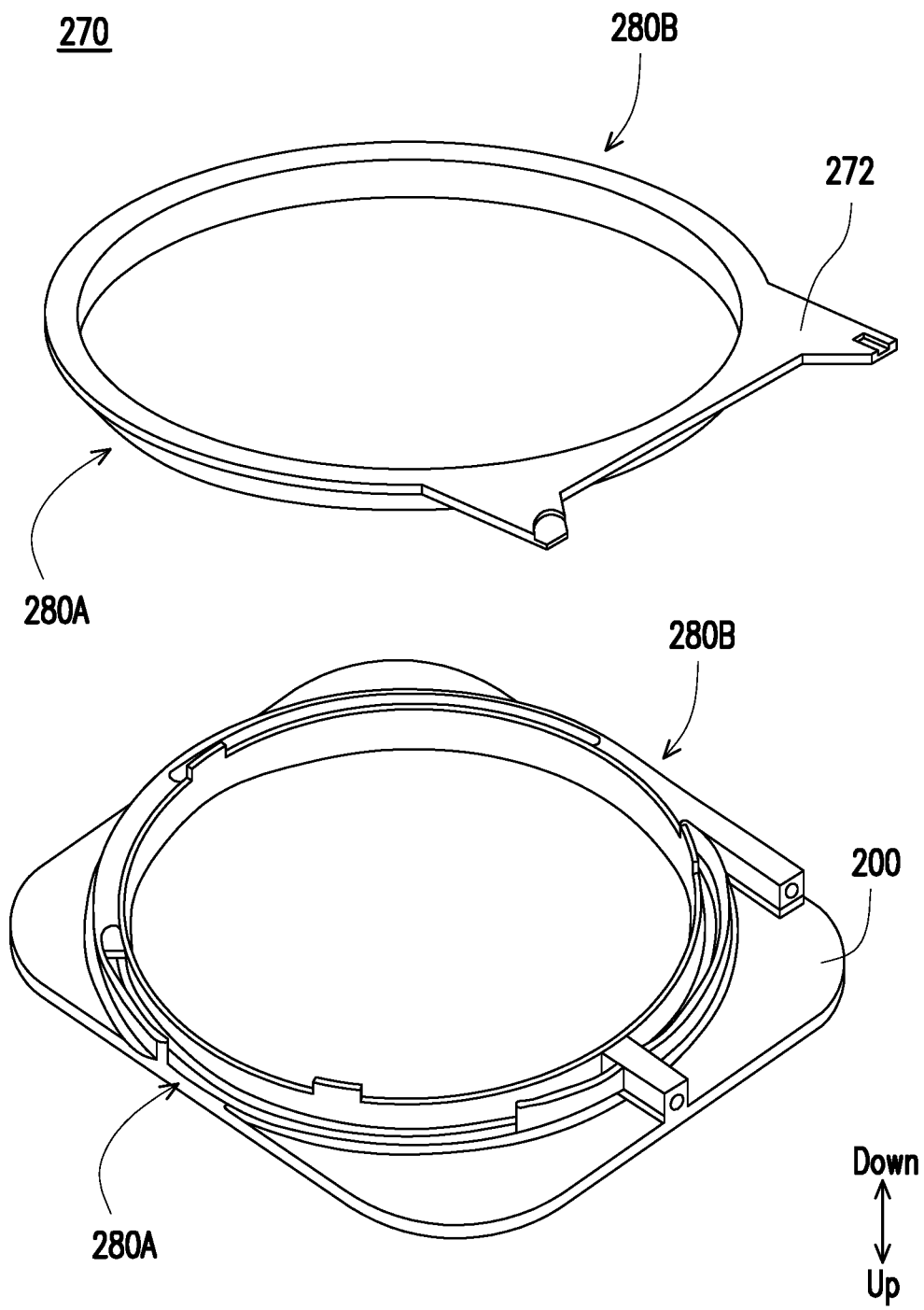
FIG. 2C is an exploded view of a susceptor ring assembly, in accordance with some embodiments.

FIG. 2C is an exploded view of a susceptor ring assembly, in accordance with some embodiments. The susceptor ring assembly 270 may include the upper susceptor ring 200 and a lower susceptor ring 272. The lower susceptor ring 272 may be configured to interface (e.g., adhere to or interlock with) with the upper susceptor ring 200, such that the upper susceptor ring 200 and the lower susceptor ring 272 may be considered to be a single piece of two parts. For example, the upper and lower susceptor rings may be joined together using any of a variety of conventional interlocks, such as at least one of a tongue and groove joint, mortise and tenon joint, dovetail joints, adhesives, nails, staples, and/or screws. The manner in which the upper and lower susceptor rings may interlock may be conventional and will not be discussed in detail herein for brevity.

In an embodiment, the susceptor ring assembly 270 may be formed of graphite. In another embodiment, the susceptor ring assembly 270 may be formed of solid Silicon Carbide (SiC) or Silicon (Si). In yet another embodiment, the susceptor ring assembly 270 may be coated with Silicon Carbide (SiC). It should be understood by one skilled in the art that the susceptor ring assembly 270 can be formed of any material with or without a coating, and the material(s) used to form the susceptor ring assembly 270 can be sufficient to absorb and retain heat generated by heating elements to prevent or reduce heat loss at the outer radial edge of a susceptor and/or a substrate while remaining substantially inert relative to the process gases introduced into a reaction space of a chamber. When assembled, the susceptor ring assembly 270 may have a left susceptor ring assembly 280A and a right susceptor ring assembly 280B, as will be discussed further below. Each of the left susceptor ring assembly 208A and the right susceptor ring assembly 280B may refer to a cross section at a particular location (e.g., left and right sides, respectively) of the susceptor ring assembly 270.

Figure 2D:
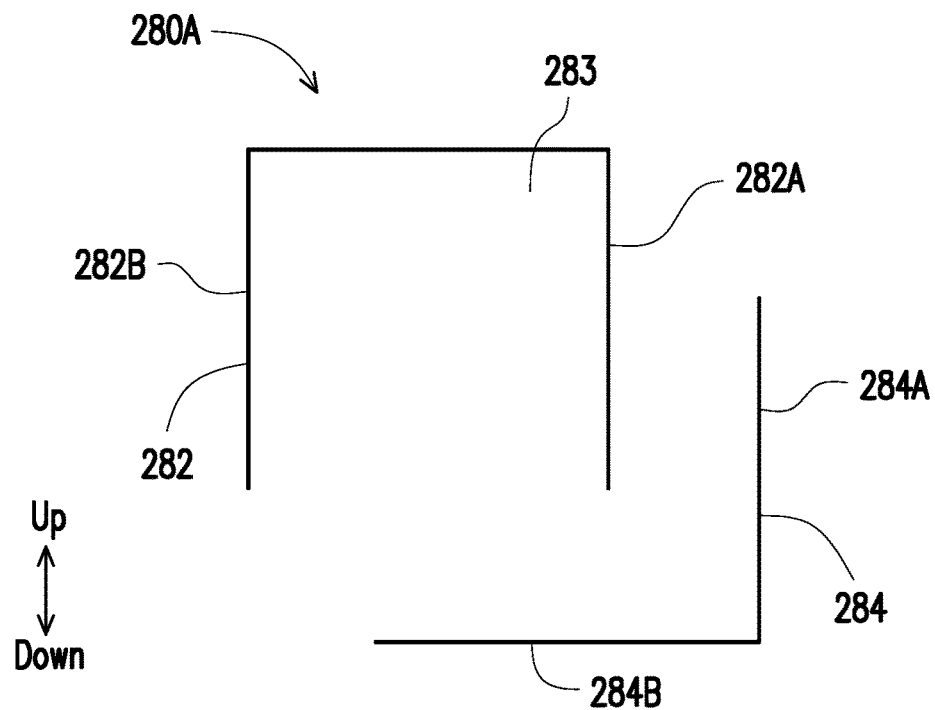
FIG. 2D is a cross sectional exploded view of a left susceptor ring assembly of FIG. 2C, in accordance with some embodiments.
Figure 2E:
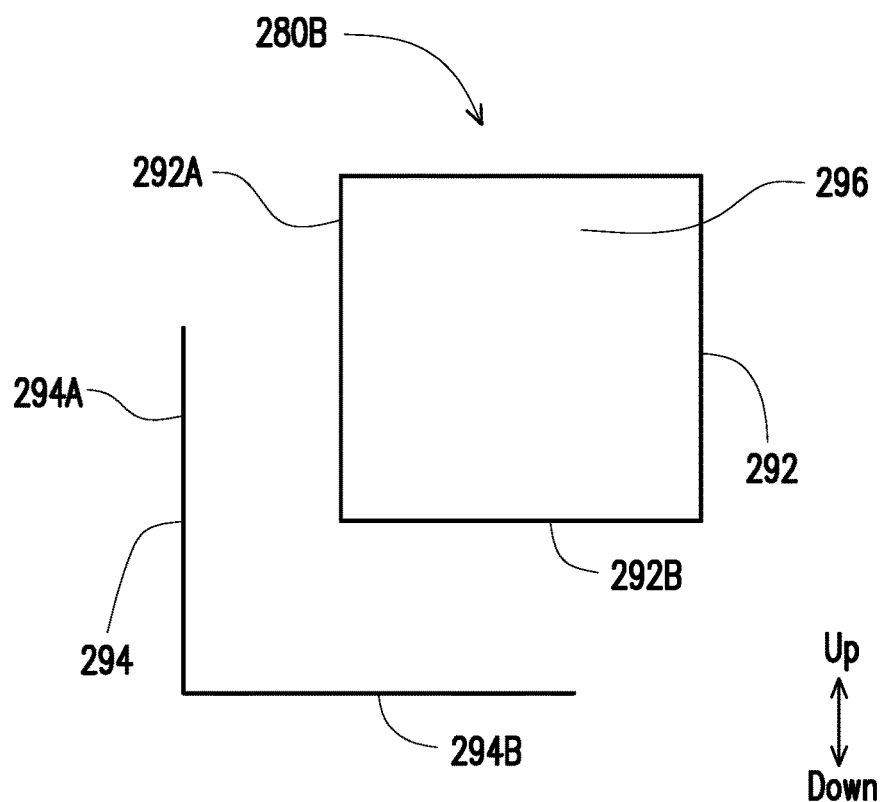
FIG. 2E is a cross sectional exploded view of a right susceptor ring assembly of FIG. 2C, in accordance with some embodiments.

FIG. 2D is a cross sectional blow out view of the left susceptor ring assembly 280A of FIG. 2C, in accordance with some embodiments. For ease of illustration, FIGS. 2D and 2E are illustrated from a top cross sectional view where up and down are not flipped, as they are in FIGS. 2A-2C. Returning to FIG. 2D, the left susceptor ring assembly 280A may include the upper susceptor ring 282 and the lower susceptor ring 284. The upper susceptor ring 282 and the lower susceptor ring 284 are illustrated as separated in order to illustrate certain details of the left susceptor ring assembly 280A, but would, upon assembly, be combined together as discussed above. Returning to FIG. 2D, the upper susceptor ring 282 may include three walls (e.g., portions or surfaces), with an open lower portion. The space between an inner ring wall 282A and an outer ring wall 282B of the upper susceptor ring 282 may be a corridor 283 within which a thermocouple, or other temperature sensing device, may be disposed. Furthermore, the open lower position may more easily facilitate placement or handling of the thermocouple within the corridor. The lower susceptor ring 284 may include two walls in a substantially L type shape. When assembled, the inner ring wall 284A of the lower susceptor ring may abut and be parallel to the inner ring wall 282A of the upper susceptor ring 282. Also, when assembled, the lower enclosure bridge, plate, or wall 284B of the lower susceptor ring 284 may bridge the inner ring wall 282A and the outer ring wall 282B of the lower susceptor ring 282. Furthermore, in certain embodiments, the lower enclosure bridge, plate, or wall 284B may extend from the inner ring wall 284A at a right angle. Accordingly, the inner ring wall 284A of the lower susceptor ring and the inner ring wall 282A of the upper susceptor ring 282 may abut each other when assembled and form a double wall of the left susceptor ring assembly 280A FIG. 2E is a cross sectional blow out view of the right susceptor ring assembly 280B of FIG. 2C, in accordance with some embodiments. The right susceptor ring assembly 280B may include an upper susceptor ring wall 292 and a lower susceptor ring wall 294. The upper susceptor ring wall 292 and the lower susceptor ring walls 294 are illustrated as separated in order to illustrate certain details of the right susceptor ring assembly 280B, but would, when assembled, be combined together as illustrated above. Returning to FIG. 2E, the upper susceptor ring wall 292 may include four walls, to completely surround an corridor 296 formed within the upper susceptor ring wall 292. The corridor 296 may be configured to house a thermocouple, or other temperature sensing device. The lower susceptor ring wall 294 may include two walls in a substantially L type shape (e.g., extending from each other at a right angle). When assembled, the inner ring wall 294A of the lower susceptor ring may abut and be parallel to the inner ring wall 292A of the upper susceptor ring 292. Also, when assembled, the lower enclosure plate or wall 294B of the lower susceptor ring 294 may abut and be parallel to the lower enclosure plate or wall 292B of the upper susceptor ring 292. Accordingly, the inner ring wall 294A of the lower susceptor ring and the inner ring wall 292A of the upper susceptor ring 292 may abut each other and form a double wall of the right susceptor ring assembly 280B. Also, the lower enclosure plate or wall 294B of the lower susceptor ring 294 and the lower enclosure plate or wall 292B of the upper susceptor ring 292 may abut each other and form a double wall of the right susceptor ring assembly 280B.

Figure 3:
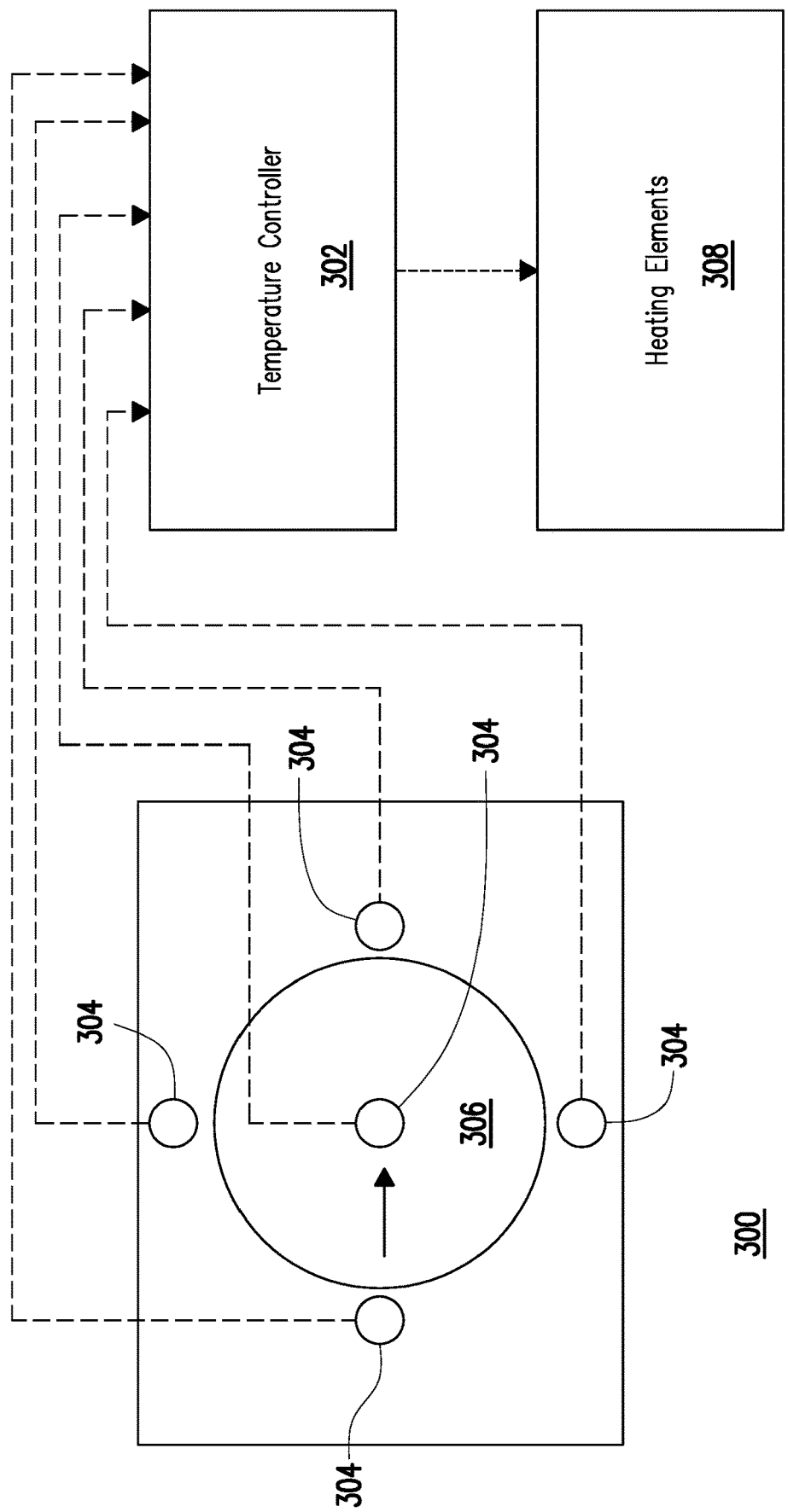
FIG. 3 is a schematic drawing of a temperature control system, in accordance with some embodiments.

FIG. 3 is a schematic drawing of a temperature control system 300, in accordance with some embodiments. The temperature control system 300 includes a temperature controller 302 and multiple temperature sensing devices. In an embodiment, the temperature sensing devices are thermocouples. The thermocouples may be single-junction, bi-junction, or multi junction thermocouples such that localized temperature measurements can be taken at different locations along the length of the thermocouple. In the illustrated embodiment, separate thermocouples are disposed within various locations 304 relative to a susceptor 306. For example, the locations 304 may correspond to a 12 o'clock, 3 o'clock, 6 o'clock, 9 o'clock and a center of the susceptor 306.

The thermocouples may provide localized temperature sensor data (e.g., temperature measurements) to the temperature controller 302 at the various locations 304. The temperature controller 302 receives the temperature sensor data from the thermocouples and determines, based on the temperature sensor data, the amount of power that is to be supplied to the heating elements 308. It should be understood by one skilled in the art that a susceptor ring assembly can be configured to receive any number of temperature measuring devices that are capable of providing localized temperature measurements at any number of locations about a substrate being processed.

Figure 4:
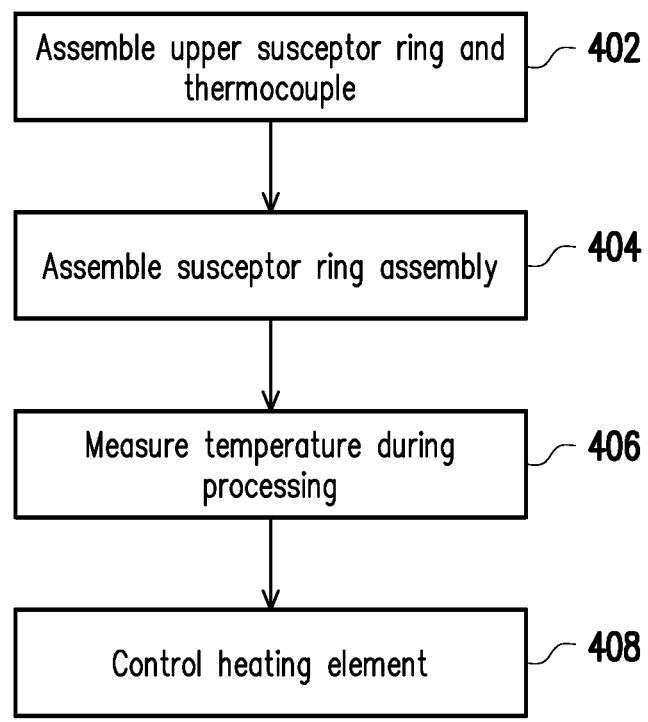
FIG. 4 is a flow chart of a susceptor ring process, in accordance with some embodiments.

FIG. 4 is a flow chart of a susceptor ring process, in accordance with some embodiments. It is noted that the process 400 is merely an example, and is not intended to limit the present disclosure. Accordingly, it is understood that additional operations may be provided before, during, and after the process 400 of FIG. 4, certain operations may be omitted, certain operations may be performed concurrently with other operations, and that some other operations may only be briefly described herein.

At operation 402, a thermocouple may be inserted into (e.g., assembled with) an upper susceptor ring. The thermocouple may be manually inserted into the upper susceptor ring between inner and outer ring walls of the upper susceptor ring.

At operation 404, the upper susceptor ring may be assembled with the lower susceptor ring. The upper and lower susceptor rings may be assembled by being adhered or interlocked together to form a susceptor ring assembly.

At operation 406, temperature measurements may be taken during wafer processing of a wafer within a reaction chamber. The temperature measurements of captured temperature sensor data may be performed by a temperature control system using the inserted thermocouple of operation 402.

At operation 408, heating elements may be controlled based on the temperature measurements of operation 406. The heating elements may be controlled to be hotter or colder based upon whether the temperature measurements of operation 206 are at or beyond a nominal value.

In an embodiment, a susceptor ring assembly for use in a semiconductor processing tool includes: an upper ring plate having an aperture formed therethrough, the upper ring plate including: a first upper ring wall extending from the upper ring plate along the aperture; a second upper ring wall extending from the upper ring plate and concentric with the first upper ring wall; a bridge extending between the first upper ring wall and the second upper ring wall; a lower ring configured to interlock with the upper ring plate, the lower ring including: a lower ring wall concentric with the first upper ring wall, wherein the lower ring wall is configured to abut the first upper ring wall; and a lower plate parallel with the bridge and extending from the lower ring wall.

In another embodiment, a susceptor ring assembly for use in a semiconductor processing tool, includes: an upper ring having an aperture formed therethrough, the upper ring including: a first upper ring wall extending from the upper ring along the aperture; a second upper ring wall extending from the upper ring and concentric with the first upper ring wall; and a lower ring configured to interlock with the upper ring, the lower ring including: a lower ring wall concentric with the first upper ring wall, wherein the lower ring wall is configured to abut the first upper ring wall; and a lower plate extending at a right angle from the lower ring wall.

In another embodiment, a method includes: inserting a thermocouple into an upper ring, wherein the upper ring includes: an aperture formed therethrough, a first upper ring wall extending from the upper ring along the aperture; and a second upper ring wall extending from the upper ring and concentric with the first upper ring wall, wherein the thermocouple is inserted between the first upper ring wall and the second upper ring wall; a bridge extending between the first upper ring wall and the second upper ring wall interlocking a lower ring with the upper ring, wherein the lower ring includes: a lower ring wall concentric with the first upper ring wall, wherein the lower ring wall is configured to abut the first upper ring wall; and a lower plate parallel with the bridge and extending from the lower ring wall.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A susceptor ring assembly for use in a semiconductor processing tool, comprising:
    an upper ring plate having an aperture formed therethrough, the upper ring plate comprising:
        a first upper ring wall extending from the upper ring plate along the aperture;
        a second upper ring wall extending from the upper ring plate and concurrent with the first upper ring wall;
        a bridge extending between the first upper ring wall and the second upper ring wall;
    a lower ring configured to interlock with the upper ring plate, the lower ring comprising:
        a lower ring wall concentric with the first upper ring wall, wherein the lower ring wall is configured to abut the first upper ring wall; and
        a lower plate parallel with the bridge and extending from the lower ring wall, wherein the lower plate abuts the bridge.

2. The susceptor ring assembly of claim 1, wherein the second upper ring wall partially encircles the first upper ring wall.

3. The susceptor ring assembly of claim 1, further comprising a thermocouple, wherein a corridor between the first upper ring wall and the second upper ring wall is configured to house the thermocouple.

4. The susceptor ring assembly of claim 1, wherein the upper ring plate comprises a rectangular shape extending in a direction orthogonal to the first upper ring wall.

5. The susceptor ring assembly of claim 1, wherein the second upper ring wall comprises an exit opening for a thermocouple, wherein the exit opening is open to a trailing edge of the upper ring plate.

6. The susceptor ring assembly of claim 1, wherein the second upper ring wall comprises three exit openings, each for a respective thermocouple.

7. A susceptor ring assembly for use in a semiconductor processing tool, comprising:
    an upper ring having an aperture formed therethrough, the upper ring comprising:
        a first upper ring wall extending from the upper ring along the aperture;
        a second upper ring wall extending from the upper ring and concentric with the first upper ring wall; and
    a lower ring configured to interlock with the upper ring, the lower ring comprising:
        a lower ring wall concentric with the first upper ring wall, wherein the lower ring wall is configured to abut the first upper ring wall; and
        a lower plate extending at a right angle from the lower ring wall, wherein the lower plate abuts the bridge.

8. The susceptor ring assembly of claim 7, wherein a bridge extends between extremities of the first upper ring wall and the second upper ring wall.

9. The susceptor ring assembly of claim 7, wherein the aperture is configured to receive a susceptor therein.

10. The susceptor ring assembly of claim 7, further comprising a thermocouple, wherein a corridor between the first upper ring wall and the second upper ring wall is configured to house the thermocouple.

11. The susceptor ring assembly of claim 7, wherein the second upper ring wall comprises an exit opening.

12. The susceptor ring assembly of claim 7, wherein the upper ring and the lower ring each comprise at least one of graphite, silicon carbide (SiC) and silicon (Si).

13. The susceptor ring assembly of claim 7, wherein the upper ring and the lower ring are each coated with Silicon Carbide (SiC).

14. A susceptor ring assembly for use in a semiconductor processing tool, comprising:
    an upper ring plate having an aperture formed therethrough, the upper ring plate comprising:
        a first upper ring wall extending from the upper ring plate along the aperture;
        a second upper ring wall extending from the upper ring plate and concentric with the first upper ring wall, wherein the second upper ring wall partially encircles the first upper ring wall;
        a bridge extending between the first upper ring wall and the second upper ring wall;
    a lower ring configured to interlock with the upper ring plate, the lower ring comprising:

a lower ring wall concentric with the first upper ring wall, wherein the lower ring wall is configured to abut the first upper ring wall; and a lower plate parallel with the bridge and extending from the lower ring wall, wherein the lower plate abuts the bridge.

15. The susceptor ring assembly of claim 14, further comprising a thermocouple, wherein a corridor between the first upper ring wall and the second upper ring wall is configured to house the thermocouple.

16. The susceptor ring assembly of claim 14, wherein the second upper ring wall comprises an exit opening for a thermocouple, wherein the exit opening is open to a trailing edge of the upper ring plate.

17. The susceptor ring assembly of claim 14, wherein the second upper ring wall comprises three exit openings, each for a respective thermocouple.

18. The susceptor ring assembly of claim 14, wherein the upper ring plate comprises a rectangular shape extending in a direction orthogonal to the first upper ring wall.

19. The susceptor ring assembly of claim 14, wherein the bridge extends between extremities of the first upper ring wall and the second upper ring wall.

20. The susceptor ring assembly of claim 14, wherein the upper ring plate and the lower ring each comprise at least one of graphite, silicon carbide (SiC) and silicon (Si).

* * * * *